United States Patent [19]

Dijkmans et al.

[11] Patent Number: 4,706,039

[45] Date of Patent: Nov. 10, 1987

[54] AMPLIFIER ARRANGEMENT

[75] Inventors: Eise C. Dijkmans; Joseph G. G. Raets, both of Eindhoven, Netherlands; Norbert J. L. Philips, Louvain, Belgium

[73] Assignee: U.S. Philips Corporation, New York, N.Y.

[21] Appl. No.: 838,729

[22] Filed: Mar. 11, 1986

[30] Foreign Application Priority Data

Mar. 18, 1985 [NL] Netherlands .................. 8500768

[51] Int. Cl.⁴ .............................................. H03F 3/30
[52] U.S. Cl. ................................... 330/297; 330/156; 330/267
[58] Field of Search ............... 330/267, 273, 297, 156, 330/202, 296

[56] References Cited

U.S. PATENT DOCUMENTS

3,961,280 6/1976 Sampei ..................... 330/297 X
4,115,742 9/1978 Yokoyama ................... 330/297

Primary Examiner—James B. Mullins
Attorney, Agent, or Firm—Robert T. Mayer; Bernard Franzblau

[57] ABSTRACT

A class-G amplifier comprises first, second and third terminals connected to a load, first supply voltage ($V_1$) and second supply voltage ($V_2$), respectively, where $V_2 > V_1$. First ($T_1$) and second ($T_2$) transistors are series-connected between the first and third terminals with the collector of $T_1$ coupled via first diode ($D_1$) to the second terminal. A third emitter follower transistor ($T_3$) has a B/E junction coupled between a signal input terminal and base of $T_1$. A first current source (5) couples the third terminal and third transistor. A driver circuit includes a first current path between the third terminal and emitter of $T_3$ comprising, in series, a second current source (7), a fourth transistor ($T_5$) and second diode ($D_4$). A second current path between a junction point (3) and common point (11) comprises, in series, third ($D_2$) and fourth ($D_3$) diodes and a third current source (8). Base of fourth transistor is connected to junction (9) and its collector is connected to third current source via fifth diode ($D_5$). A low input voltage cuts off second transistor so first transistor connected to second terminal. Above a given voltage, driver circuit turns second transistor on so first transistor connected to third terminal. The output (2) thereby attains a voltage equal to second supply voltage ($V_2$) minus one B/E voltage.

15 Claims, 8 Drawing Figures

AMPLIFIER ARRANGEMENT

BACKGROUND OF THE INVENTION

This invention relates to an amplifier arrangement comprising:

a first transistor having an emitter which is coupled to a first terminal for connection to a load which is coupled to a reference point, and having a collector which is coupled by means of a first semiconductor junction to a second terminal for a first supply voltage, a second transistor having a collector-emitter path which is connected in series with the collector-emitter path of the first transistor, and having a collector which is coupled to a third terminal for a second supply voltage which is higher than the first supply voltage, and a third transistor arranged as an emitter-follower and having a base for receiving an input signal and having an emitter which is coupled to the base of the first transistor.

The invention also relates to a push-pull amplifier equipped with such an amplifier arrangement.

Such an amplifier arrangement of the class-G type may be employed as a power amplifier for audio signals. A class-G amplifier is to be understood to mean an amplifier in which the effective supply voltage increases in a number of steps depending on the input signal. This results in an amplifier having a high efficiency.

Such an amplifier arrangement is disclosed in U.S. Pat. No. 3,961,280. In this known arrangement the input signal is applied to the bases of the first transistor and the second transistor via a third transistor arranged as an emitter follower. For low input voltages the second transistor is cut off so that the first transistor is connected to the first supply voltage. If the input voltage becomes higher than the first supply voltage, the second transistor is turned on so that the first supply voltage is disconnected and the first transistor is connected to the second supply voltage.

When the second transistor does not conduct, the voltage across the base-emitter junction of this transistor is at the most equal to substantially the full first supply voltage. In order to preclude breakdown of the base-emitter junction as a result of this voltage, a diode is arranged in the base line of the second transistor. In order to prevent the first transistor from being bottomed and thereby producing distortion when the second transistor is not yet fully conductive, two series-connected diodes are arranged in the base line of the first transistor.

However, a drawback of these diodes is that they limit the swing of the output signal and, consequently, the efficiency of the amplifier arrangement. For the maximum output the voltage on the base of the third transistor is substantially equal to the second supply voltage. The voltage on the output is then equal to the second supply voltage minus the sum of the base-emitter voltage of the first transistor and the third transistor and the diode voltage across the two diodes arranged in the base line of the first transistor.

SUMMARY OF THE INVENTION

It is an object of the invention to provide a class-G-type amplifier arrangement which has an improved output-voltage swing in comparison with the known arrangement. In accordance with the invention an amplifier arrangement of the type defined in the opening paragraph is characterized in that the third transistor is of a conductivity type opposite to that of the first transistor and the second transistor and its emitter is coupled to the third terminal by means of a first current source, a first current path is arranged between the third terminal and an electrode of the third transistor which carries the input signal, which first current path comprises the series arrangement of at least a second current source, the emitter-collector path of a fourth transistor of the same conductivity type as the third transistor, and a second semiconductor junction, the emitter of the fourth transistor is coupled to the base of the second transistor, a second current path is arranged between the second terminal and the reference point and comprises the series arrangement of a third semiconductor junction, a fourth semiconductor junction and a third current source, a point between the collector of the fourth transistor and the second semiconductor junction is connected to the third current source by means of a fifth semiconductor junction, and the base of the fourth transistor is connected to a point between the third semiconductor junction and the fourth semiconductor junction.

In such an amplifier arrangement it is possible to drive the output to a voltage equal to the second supply voltage minus the sum of one base-emitter voltage and two saturation voltages, which yields a substantially improved output voltage swing and hence a substantially improved efficiency. The amplifier arrangement also has the advantage that it can be fully integrated.

In such an amplifier arrangement in accordance with the invention, the first transistor and the second transistor are each preferably constituted by a Darlington pair. The maximum output voltage swing is then one base-emitter voltage lower than in the case of single first and second transistors. In this case the maximum output voltage swing can be increased by one base-emitter voltage by bootstrapping. In accordance with a further embodiment the amplifier arrangement may then be characterized in that the first current source and the second current source are connected to the third terminal by means of a first resistor and the first terminal is connected to that end of the first resistor which is not connected to the third terminal by means of a capacitor. This embodiment may be characterized in that the first current source and the second current source are constituted by a second resistor and a third resistor, respectively.

An amplifier arrangement in accordance with a further embodiment of the invention may be characterized in that the second semiconductor junction is the emitter-base junction of a sixth transistor arranged as an emitter follower. This precludes the occurrence of distortion as a result of a sudden decrease in input resistance of the arrangement when the second transistor is turned on.

An amplifier arrrangement in accordance with the invention is very suitable for use in a push-pull amplifier which comprises two complementary amplifier arrangements in which the emitters of the complementary first transistors are connected to a common first terminal for connection to a common load. This push-pull amplifier may be characterized further in that the third current sources of the two complementary amplifier arrangements are commoned to form one common current source and in that the collectors of the third transistors are coupled to the common first terminal.

BRIEF DESCRIPTION OF THE DRAWINGS

Embodiments of the invention will now be described in more detail, by way of example, with reference to the accompanying drawings, in which.

DESCRIPTION OF THE PREFERRED EMBODIMENTS

Figure 1:
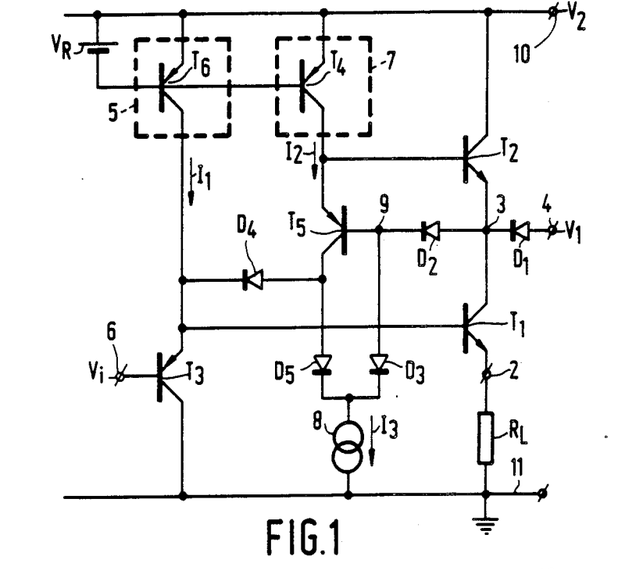
FIG. 1 is the basic diagram of an amplifier arrangement in accordance with the invention.

FIG. 1 shows the basic diagram of an amplifier arrangement in accordance with the invention. The arrangement comprises a first NPN transistor $T_1$, whose emitter is connected to the output 2 to which a load $R_L$ is connected. By means of a first diode $D_1$ the collector of the transistor $T_1$ is connected to a terminal 4 for a first supply voltage $V_1$. The collector-emitter path of a second NPN transistor $T_2$ is arranged in series with the collector-emitter path of the transistor $T_1$ and the collector of this transistor $T_2$ is connected to a terminal 10 for a second supply voltage $V_2$ which is higher than the first supply voltage $V_1$. The base of the transistor $T_1$ is connected to the emitter of a PNP transistor $T_3$, arranged as an emitter follower. The emitter of this transistor is connected to the terminal 10 for the supply voltage $V_2$ by means of a first current source 5 supplying a current $I_1$. The current source 5 comprises a PNP transistor $T_6$ whose base is at a reference voltage $V_R$. The collector of the transistor $T_3$ is connected to the terminal 11 which is common to the first supply voltage $V_1$ and the second supply voltage $V_2$. The input signal $V_i$ is applied to the base 6 of the transistor $T_3$. A first current path is arranged between the terminal 10 for the supply voltage $V_2$ and the emitter of the transistor $T_3$ and comprises the series arrangement of a second current source 7, the emitter-collector path of a PNP transistor $T_5$ and a second diode $D_4$. The second current source supplies a current $I_2$ and comprises a PNP transistor $T_4$ whose base is at the reference voltage $V_R$. The emitter of the transistor $T_5$ is connected to the base of the transistor $T_2$. A second current path is arranged between the junction point 3 between the transistor $T_1$ and the transistor $T_2$ and the common terminal 11 and comprises the series arrangement of a third diode $D_2$, a fourth diode $D_3$ and a third current source 8. The current $I_3$ carried by this current source is smaller than the current $I_2$ supplied by the current source 7. The base of the transistor $T_5$ is connected to the junction point 9 between the diodes $D_2$ and $D_3$ and its collector is connected to the current source 8 by means of a fifth diode $D_5$.

The arrangement operates as follows. For low input voltages $V_i$ the transistor $T_3$ receives the current $I_1$ from the current source 5 directly and the current $I_2$ from the current source 7 via the collector-emitter path of the transistor $T_5$ and the diode $D_4$. If the base current of the transistor $T_5$ is ignored the current $I_3$ carried by the current source 8 is furnished by the first power supply voltage $V_1$ via the diodes $D_1$, $D_2$ and $D_3$. In this situation the diode $D_5$ is cut off. The voltage between the base and the emitter of the transistor $T_2$ is substantially 0 V because this voltage is equal to the difference between the base-emitter voltage of the transistor $T_5$ and the voltage across the diode $D_2$. Consequently, the transistor $T_2$ is cut off so that for low input voltages the collector of the transistor $T_1$ is connected to the power supply voltage $V_1$ via the diode $D_1$. The input signal $V_i$ is applied to the base of the transistor $T_1$ via the emitter-follower transistor $T_3$. This input signal $V_i$ also appears on the anode of the diode $D_5$. The voltage on the cathode of the diode $D_5$ is three diode voltages lower than the supply voltage $V_1$. Therefore, the diode $D_5$ is turned on for a specific input voltage $V_i$. A part of the input voltage $V_i$ then appears on the cathode of the diode $D_2$. As the input voltage $V_i$ increases further the diode $D_2$ will become less conductive, so that the current for the current source 8 through the diode $D_3$ decreases and that through the diode $D_5$ increases. Above a specific input voltage the diode $D_2$ is turned off so that substantially the entire current $I_3$ flows through the diode $D_5$. Then only the base current of the transistor $T_5$ flows through the diode $D_3$. The voltage on the base of the transistor $T_2$ follows the voltage $V_i$ via the base-emitter junction of the transistor $T_5$, the diodes $D_3$, $D_5$ and $D_4$, and the base-emitter junction of the transistor $T_3$. As this input voltage increases further the transistor $T_2$ is therefore turned on so that the voltage on the junction point 3 also increases. At a specific input voltage the diode $D_1$ is cut off so that the collector of the transistor $T_1$ is connected to the high supply voltage $V_2$ via the collector-emitter path of the transistor $T_2$. As the input voltage $V_i$ increases further the transistor $T_4$ will be bottomed, so that the voltage on the base of the transistor $T_2$ cannot increase any further. Subsequently, the transistor $T_1$ is bottomed and the diode $D_4$ is cut off. The entire current $I_1$ from the current source 5 then flows into the base of the transistor $T_1$ so that there is no current in the transistor $T_3$.

The maximum output voltage is then reached. The voltage $V_O$ on the output 2 is now equal to:

$$V_{OMAX} = V_2 - (V_{CEST4} + V_{BET2} + V_{CEST1}) \quad (1)$$

where $V_{CEST4}$ = the collector-emitter voltage of the transistor $T_4$ during saturation, $V_{CEST1}$ = the collector-emitter voltage of the transistor $T_1$ during saturation, and $V_{BET2}$ = the base-emitter voltage of the transistor $T_2$.

As the voltage $V_{CEST4}$ and $V_{CEST1}$ are substantially 100 mV, it follows from the above equation that the output 2 can be driven to the value of the second supply voltage $V_2$ minus substantially one base-emitter voltage ($\approx 0.6$ V). As a result of this large output voltage swing the amplifier arrangement has a high efficiency.

Figure 2:
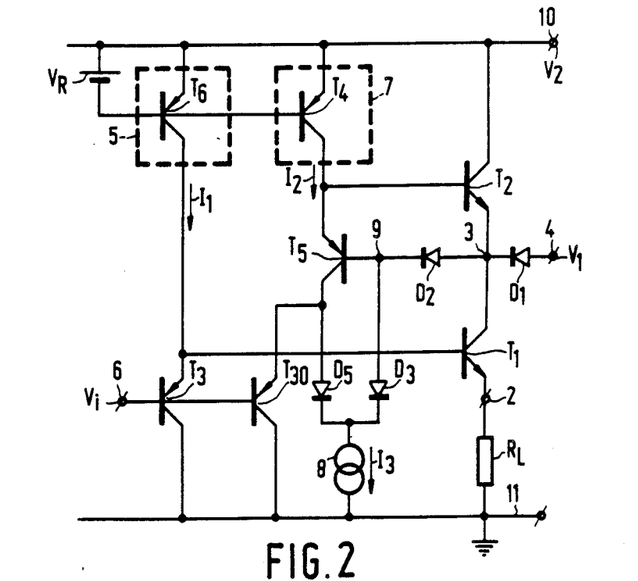
FIG. 2 shows a modification of the arrangement of FIG. 1.

FIG. 2 is a modification of the arrangement shown in FIG. 1 in which identical parts bear the same reference numerals as in FIG. 1. During the change-over from the first supply voltage $V_1$ to the second supply voltage $V_2$ the voltage between the collector and the base of the transistor $T_1$ in the arrangement shown in FIG. 1 is equal to one diode voltage, namely the sum of the voltages across the diodes $D_4$, $D_5$, $D_3$ and the base-emitter junctions of the transistors $T_5$ and $T_2$. This means that during change-over to the second supply voltage $V_2$ the first transistor $T_1$ is not yet driven into full conduction. In the embodiment shown in Fig.2, the diode $D_4$ is replaced by the base-emitter junction of a transistor $T_{30}$, which has its emitter connected to the collector of the ttansistor $T_5$, its base to the base of the transistor $T_3$, and its collector to the common terminal 11. During the change-over from the first supply voltage $V_1$ to the second supply voltage $V_2$ a voltage of zero volts appears between the collector and the base of the transistor $T_1$ so that change over is effected at the instant at which the transistor $T_1$ will be saturated. As a result of this, the transistor $T_1$ is driven over the entire range of the first supply voltage $V_1$, which leads to an increased efficiency. Otherwise, the operation and the output voltage swing of the arrangement are the same as for the arrangement shown in FIG. 1.

Figure 3:
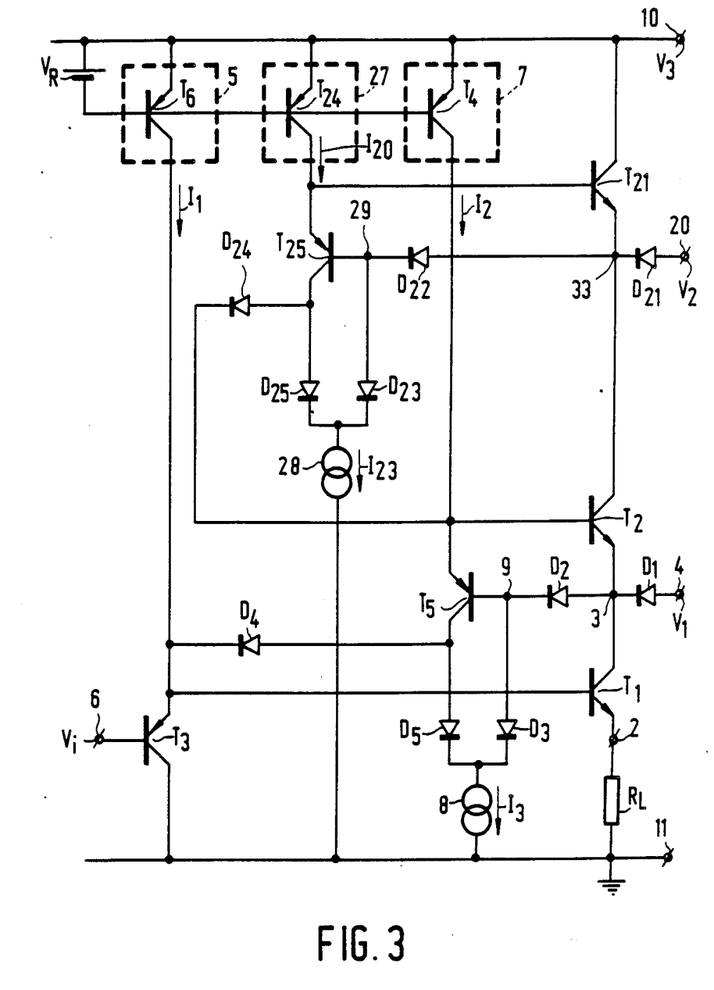
FIG. 3 shows an extended version of the amplifier arrangement of FIG. 1.

The principle of two supply voltages as explained with reference to FIGS. 1 and 2 may be extended to an arbitrary number of supply voltages. Fig.3 shows an amplifier arrangement with three supply voltages, in which Figure identical parts bear the same reference numerals as in Fig.1. A transistor $T_{21}$ has its collector-emitter path connected in series with the collector-emitter path of the transistor $T_2$ and has its collector connected to a third supply voltage $V_3$. The collector of the transistor $T_2$ is now connected to the second supply voltage $V_2$ via a diode $D_{21}$ and the current source 7 is connected to the third supply voltage $V_3$. The driver circuit for the transistor $T_{21}$ is of the same type as that for the transistor $T_2$. A current source 27 supplying a current $I_{20}$ is arranged between the third power supply voltage $V_3$ and the base of the transistor $T_{21}$. This current source 27 comprises a transistor $T_{24}$, whose base is at a reference voltage $V_R$. The base of the transistor $T_{21}$ is connected to the base of the transistor $T_2$ by the series arrangement of the emitter-collector path of a transistor $T_{25}$ and a diode $D_{24}$. The series arrangement of two diodes $D_{22}$, $D_{23}$ and a current source 28 carrying a current $I_{23}$ is arranged between the junction point 33 between the emitter of the transistor $T_{21}$ and the collector of the transistor $T_2$ and the common terminal 11. The base of the transistor $T_{25}$ is connected to the junction point 29 between the diode $D_{22}$ and the diode $D_{23}$ and the collector of the transistor $T_{25}$ is connected to the current source 28 by means of a diode $D_{25}$.

The operation of the circuit arrangement can be explained very simply by means of the principle described with reference to Fig.1. For low input voltages $V_i$ the transistor $T_1$ is coupled to the first supply voltage $V_1$. The transistors $T_2$ and $T_{21}$ and the diodes $D_5$ and $D_{25}$ are cut off. The current $I_{20}$ from the current source 27 flows to the emitter of the transistor $T_5$ via the emitter-collector path of the transistor $T_{25}$ and the diode $D_{24}$ and further to the emitter of the transistor $T_3$ via the emitter-collector path of the transistor $T_5$ and the diode $D_4$. The current $I_{23}$ carried by the current source 28 is derived from the supply voltage $V_2$ via the diodes $D_{23}$, $D_{22}$ and $D_{21}$. At increasing input voltages $V_i$ the transistor $T_2$ is driven into conduction and the first supply voltage $V_1$ is disconnected, as described with reference to Fig.1. At a further increase the transistor $T_2$ is driven further into conduction. Above a specific input voltage $V_i$ the diode $D_{25}$ is turned on. As a result of this, the transistor $T_{21}$ is turned on and the diode $D_{22}$ is turned off, so that above a specific input voltage the second supply voltage $V_2$ is disconnected and the collector of the transistor $T_1$ is coupled to the third supply voltage $V_3$. As the input voltage $V_i$ increases further the transistor $T_{24}$ is bottomed. The voltage on the base of the transistor $T_{21}$ then cannot increase any further. If the input voltage $V_i$ increases even further, the diode $D_{24}$ is cut off, after which the transistor $T_2$ is bottomed, in which situation the voltage on the base of the transistor $T_2$ can increase until the transistor $T_4$ is bottomed. Subsequently, the diode $D_4$ is cut off and the transistor $T_1$ is saturated. As a result of this, there is no current in the transistor $T_3$ so that the maximum output voltage is reached. The maximum voltage $V_0$ on the output 2 is then equal to:

$$V_{OMAX} = V_3 - (V_{CEST24} + V_{BET21} + V_{CEST2} + V_{CEST1}) \quad (2)$$

where
$V_{CEST24}$ = the collector-emitter voltage of the transistor $T_{24}$ in the case of saturation.

It is to be noted that in the present embodiment the diode $D_4$ may be connected to the collector of the transistor $T_5$ instead of to the emitter. As a result of this, the change-over from the second supply voltage $V_2$ to the third supply voltage $V_3$ is effected at the instant at which the transistor $T_2$ is saturated, so that the transistor $T_2$ is driven to an optimum extent.

Figure 4:
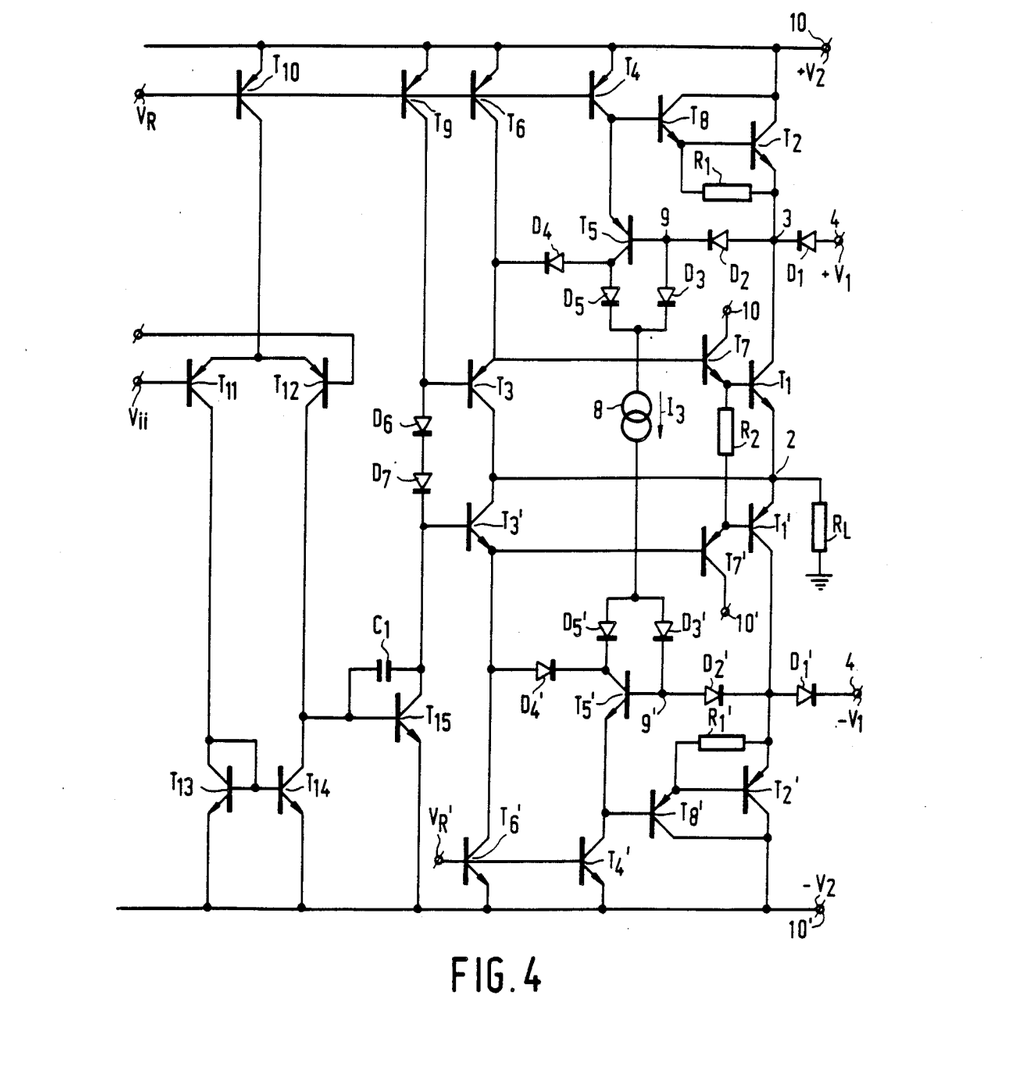
FIG. 4 shows a push-pull amplifier in accordance with a first embodiment of the invention.

The amplifier arrangement in accordance with the invention is very suitable for use in a push-pull amplifier, of which FIG. 4 shows a first embodiment. The push-pull amplifier comprises an input stage, which in the present embodiment has its simplest form and comprises two transitors $T_{11}$ and $T_{12}$ arranged as a differential pair, whose common emitter terminal is connected to the positive second supply voltage $+V$ by means of a current source comprising a transistor $T_{10}$ whose base is at a reference voltage $V_R$. The input signal $V_{ii}$ of the push-pull amplifier is applied between the bases of the transistors $T_{11}$ and $T_{12}$. The collector of the transistor $T_{12}$ is connected directly to the output of the input stage and the collector of the transistor $T_{11}$ is connected to the said output by means of a current mirror comprising the transistors $T_{13}$ and $T_{14}$, which output is connected to the input of a Miller stage. In the present example, the Miller stage comprises a transistor $T_{15}$, whose emitter is connected to the negative supply voltage $-V_2$. A frequency compensation capacitor $C_1$ is arranged between the collector and the base of the transistor $T_{15}$. The collector of the transistor $T_{15}$ is connected to the positive supply voltage $+V_2$ by the series arrangement of two diodes $D_6$ and $D_7$ and a current source comprising the transistor $T_9$, whose base is at a reference voltage $V_R$. The output stage comprises two complementary circuits, which are each substantially identical to the circuit arrangement shown in FIG. 1. Therefore, identical parts bear the same reference numerals as in FIG. 1, the complementary parts being denoted by primes. The arrangement differs from that shown in FIG. 1 with respect to the following points. The transistor $T_2$ and the transistor $T_8$ are arranged as a Darlington pair, a resistor $R_1$ being arranged between the base and the emitter of the transistor $T_2$ to provide a rapid turn-off of the Darlington pair. A resistor or a diode may be arranged between the base and the emitter of the transistor $T_8$ for protection purposes, and in the case of a diode its forward direction should be opposite to that of the base-emitter junction of the transistor $T_8$. Similarly, the transistor $T_1$ forms a Darlington pair with a transistor $T_7$. The emitters of the complementary output transistor $T_1$ and $T_1'$ are connected to the common output 2, to which the load $R_L$ is connected. A resistor $R_2$ is arranged between the emitters of the transistors $T_7$ and $T_7'$ and has the same function as the resistor $R_1$. The current source 8 is common to the two complementary circuits.

The collectors of the transistors $T_3$ and $T_3'$ are interconnected and are also connected to the output 2. It is to be noted that the collectors of the transistors $T_3$ and $T_3'$ may alternatively be connected to the emitter of the transistor $T_7'$ and the emitter of the transistor $T_7$, respectively or, if resistors having low resistance values are arranged in the emitter lines of the transistors $T_1$ and $T_1'$, to the emitter of the transistor $T_1'$ and the emitter of the transistor $T_1$, respectively. The output signal of the Miller stage is applied to the bases of the transistors $T_3$ and $T_3'$. The diodes $D_6$ and $D_7$ between the bases of the transistors $T_3$ and $T_3'$ provide a class-AB bias for the output stage. The push-pull principle is known per se and therefore will not be explained here. Since the transistor $T_2$ and the transistor $T_8$ are arranged as a Darlington pair, the maximum output voltage swing is now equal to:

$$V_{OMAX} = +V_2 - (V_{CEST4} + V_{BET8} + V_{BET2} + V_{CEST1}) \quad (3)$$

Consequently, the maximum output voltage is one baseemitter voltage lower than for the arrangement in FIG. 1. The minimum output voltage lies equally far above the negative supply voltage $-V_2$ as the maximum output voltage lies below the positive supply voltage $+V_2$.

Figure 5:
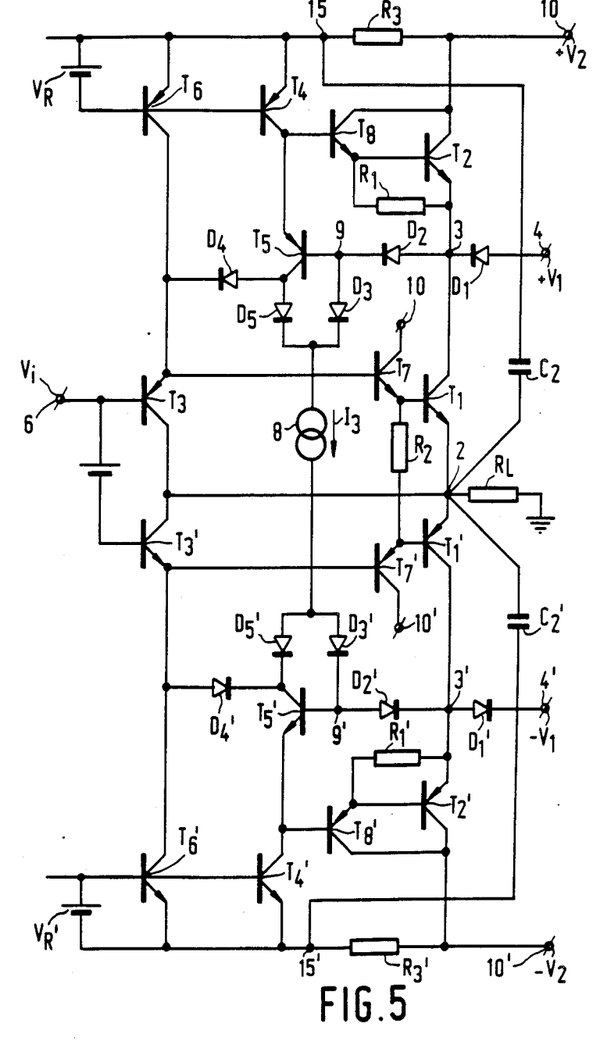
FIG. 5 shows a push-pull amplifier in accordance with a second embodiment of the invention.

A second example of a push-pull amplifier in accordance with the invention is described with reference to FIG. 5. For simplicity only the output stage, which is relevant to the invention, is shown, and identical parts bear the same reference numerals as in FIG. 4. The emitters of the transistors $T_4$ and $T_6$ are connected to the terminal 10 for the supply voltage $+V_2$ by means of a resistor $R_3$. A capacitor $C_2$ is arranged between the output 2 and the end 15 of the resistor $R_3$ which is not connected to the terminal 10. By means of the capacitor $C_2$ the output signal is boot-strapped so that the voltage on the collectors of the transistors $T_4$ and $T_6$ can be raised above the supply voltage $+V_2$. As far as the operation of the arrangement is concerned this results in the transistor $T_8$, instead of the transistor $T_4$, being saturated when the transistors $T_8$ and $T_2$ are turned on as a result of an increasing input signal. The collector of the transistor $T_8$ is now connected to the supply voltage $+V_2$, while as a result of bootstrapping the base of the transistor $T_8$ can be driven beyond this supply voltage. Therefore, the maximum output voltage becomes equal to:

$$V_{OMAX} = V_2 - (V_{CEST8} + V_{BET2} + V_{CEST1}) \quad (4)$$

where $V_{CEST8}$ = the collector-emitter voltage of the transistor $T_8$ in the case of saturation.

Bootstrapping results in an increase of the maximum output voltage swing of the arrangement by one baseemitter voltage. It is to be noted that in the present embodiment the current-source transistor $T_{10}$ of the input stage (see FIG. 4) is connected directly to the positive second supply voltage $+V_2$ and that the emitters of the transistors $T_{13}$, $T_{14}$ and $T_{15}$ are connected directly to the negative supply voltage $-V_2$.

A third embodiment of a push-pull amplifier is described with reference to FIG. 6, in which identical parts bear the same reference numerals as in FIG. 5. In the present embodiment the current-source transistors $T_4$ and $T_6$ are replaced by a resistor $R_4$ and a resistor $R_5$, respectively. As a result of bootstrapping the same signal voltage appears on the base of the transistor $T_8$ and on the cathode of the diode $D_4$ as on point 15. Consequently, a constant voltage is obtained across these resistors, so that the resistors $R_4$ and $R_5$ again operate as current sources.

Figure 6:
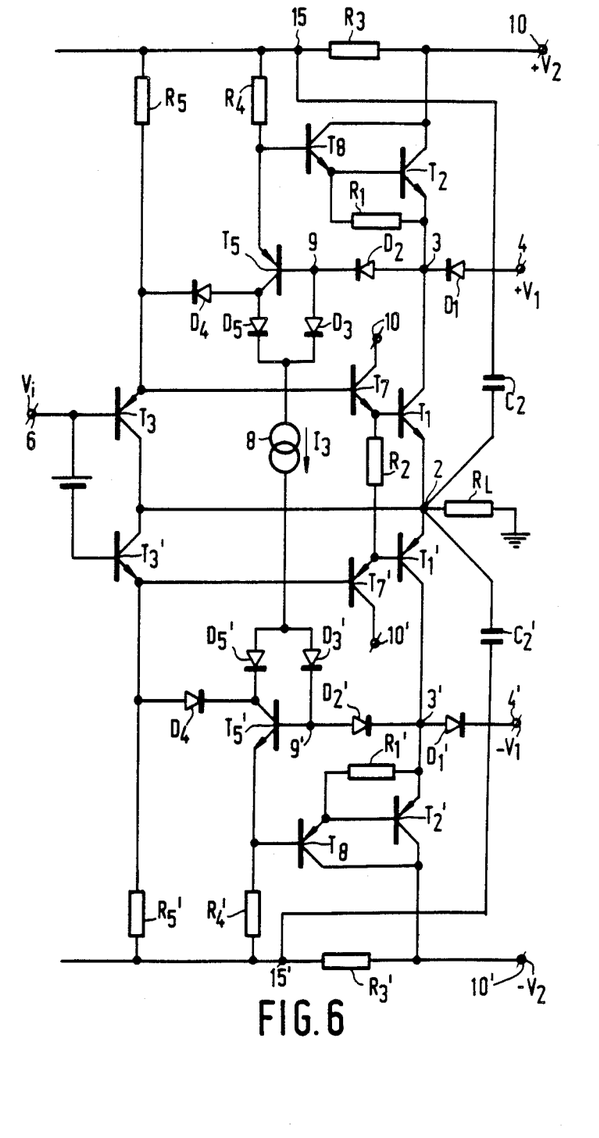
FIG. 6 shows a push-pull amplifier in accordance with a third embodiment of the invention.
Figure 7:
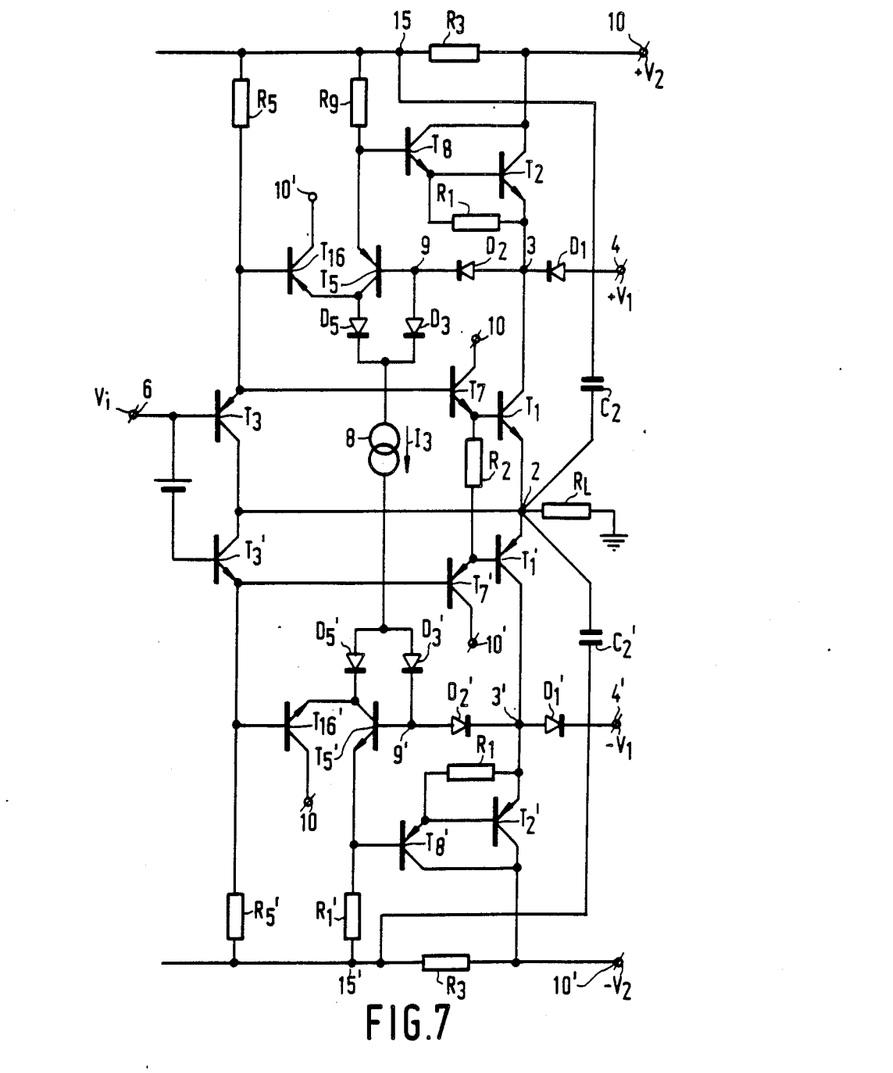
FIG. 7 shows a push-pull amplifier in accordance with a fourth embodiment of the invention.

FIG. 7 shows a push-pull amplifier in accordance with the fourth embodiment of the invention, and identical parts bear the same reference numerals as in FIG. 6. This embodiment differs from that shown in FIG. 6 in that the diode $D_4$ is replaced by an emitter-follower transistor $T_{16}$, whose emitter is connected to the collector of the transistor $T_5$, whose collector is connected to the negative supply voltage $-V_2$, and whose base is connected to the emitter of the transistor $T_3$. When, in the embodiment shown in FIG. 4, the transistors $T_8$, $T_2$ are turned on the resistance at the emitter of the transistor $T_3$ decreases suddenly because the resistance which is seen at the base of the transistor $T_8$ is connected in parallel with the resistance which is seen at the base of the transistor $T_7$. This results in a sudden decrease of the input resistance of the arrangement, which leads to distortion of the input signal. By replacing the diode $D_4$ by a transistor $T_{16}$, the resistance which is connected in parallel with the input resistance of the transistor $T_7$ when the transistors $T_8$, $T_2$ are turned on is increased by a factor equal to the currentgain factor of the transistor $T_{16}$. Thus, when the transistors $T_8$, $T_2$ are turned on the decrease in the input resisresistance of the transistor $T_3$ is substantially smaller, so that the resulting distortion is also reduced substantially. It is to be noted that the emitter-follower transistor $T_{16}$ may also be used in the embodiments shown in FIGS. 1, 2 and 3.

Figure 8:
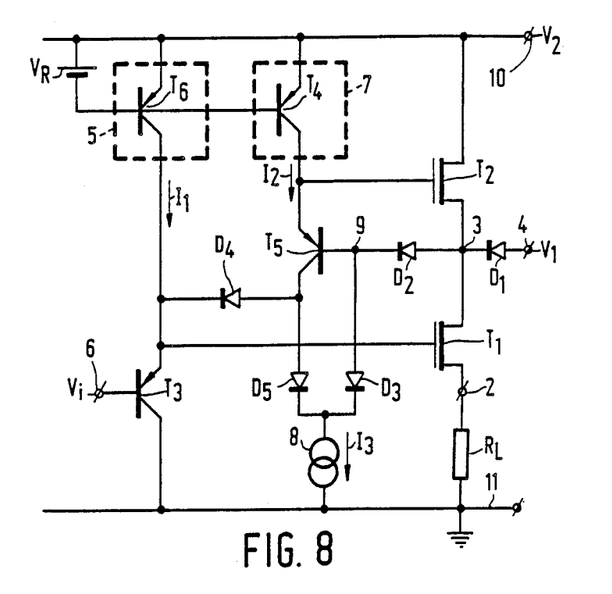
FIG. 8 shows the amplifier of FIG. 1 which uses FET transistors $T_1$ and $T_2$.

The invention is not limited to the embodiments shown. Within the scope of the invention many modifications will become obvious to those skilled in the art. For example, the diodes in the present embodiments may be replaced by diode-connected transistors. Further, all or some of the bipolar transistors in the arrangement, as shown, for example, in FIG. 8, may be replaced by MOS transistors, in which case "emitter", "collector" and "base" should read: "source", "drain" and "gate", respectively.

Finally, it is to be noted that the embodiments shown in FIGS. 4, 5, 6 and 7 may also be equipped with the amplifier arrangement shown in FIG. 3.

What is claimed is:

1. An amplifier arrangement comprising:
    a first transistor having an emitter coupled to a first terminal for connection to a load which is coupled to a reference point, a collector coupled by means of a first semiconductor junction to a second terminal for a first supply voltage
    a second transistor having a collector-emitter path connected in series with the collector-emitter path of the first transistor, and having a collector coupled to a third terminal for a second supply voltage which is higher than the first supply voltage, a third transistor arranged as an emitter-follower and having a base for receiving an input signal and having an emitter coupled to a base of the first transistor, characterized in that the third transistor is of a conductivity type opposite to that of the first transistor and the second transistor and its emitter is coupled to the third terminal by means of a first current source, a first current path is coupled between the third terminal and an electrode of the third transistor which carries the input signal, which first current path comprises a series arrangement of at least a second current source, the emitter-collector path of a fourth transistor of the same conductivity type as the third transistor, and a second semiconductor junction, the emitter of the fourth transistor is coupled to the base of the second transistor, a second current path is coupled between the second terminal and the reference point and comprises series arrangement of a third semiconductor junction, a fourth semiconductor junction and a third current source, a point between the collector of the fourth transistor and the second semiconductor junction is connected to the third current source by means of a fifth semiconductor junction, and a base of the fourth transistor is connected to a point between the third semiconductor junction and the fourth semiconductor junction.

2. An amplifier arrangement as claimed in claim 1 characterized in that the second semiconductor junction is coupled to the emitter of the third transistor.

3. An amplifier arrangement as claimed in claim 1 characterized in that the second semiconductor junction comprises the base-emitter junction of a fifth transistor of the same conductivity type as the third transistor, and with its base connected to the base of the third transistor and its emitter coupled to the collector of the fourth transistor.

4. An amplifier arrangement as claimed in claim 1 characterized in that the first current source and the second current source are connected to the third terminal by means of a first resistor and the first terminal is connected, by means of a capacitor, to that end of the first resistor which is not connected to the third terminal.

5. An amplifier arrangement as claimed in claim 4 characterized in that the first current source and the second current source comprise a second resistor and a third resistor, respectively.

6. An amplifier arrangement as claimed in claim 1 characterized in that the second semiconductor junction comprises the emitter-base junction of a further transistor arranged as an emitter follower.

7. An amplifier as claimed in claim 1 wherein the second semiconductor junction comprises an emitter-base junction of a further transistor connected as an emitter follower.

8. An amplifier arrangement as claimed in claim 1 further comprising a further first transistor coupled to said first transistor to form a Darlington pair and a further second transistor coupled to said second transistor to form a further Darlington pair.

9. An amplifier comprising:

first, second and third terminals for connection to a load, a first supply voltage and a second supply voltage, respectively, where the second supply voltage is higher than the first supply voltage, first and second transistors connected in series between the first and third terminals, a first semiconductor junction coupled between the second terminal and a first junction point between the first and second transistors, a third transistor connected as an emitter-follower having a base for receiving an input signal and an emitter coupled to a control electrode of the first transistor, said third transistor being of a conductivity type opposite to that of the first transistor, a first current source coupling the emitter of the third transistor to the third terminal, a first current path coupled between the third terminal and an electrode of the third transistor at which an input signal is present, said first current path comprising a series arrangement of a second current source, the emitter-collector path of a fourth transistor of the same conductivity type as the third transistor, and a second semiconductor junction, means coupling a control electrode of the second transistor a second junction point between the second current source and the fourth transistor, a second current path coupled to the second terminal and comprising a series arrangement of third and fourth semiconductor junctions and a third current source, a fifth semiconductor junction coupling the fourth transistor to the third current source, and means connecting a control electrode of the fourth transistor to a third junction point between the third and fourth semiconductor junctions.

10. An amplifier as claimed in claim 9 wherein the second semiconductor junction is coupled to the emitter of the third transistor.

11. An amplifier as claimed in claim 9 wherein the second semiconductor junction comprises a B/E junction of a fifth transistor of the same conductivity type as the third transistor and having its base connected to the base of the third transistor and its emitter coupled to the fourth transistor.

12. An amplifier as claimed in claim 9 further comprising a resistor coupling the first and second current sources to the third terminal, and a capacitor coupling the first terminal to a further junction point between the resistor and the first and second current sources.

13. an amplifier as claimed in claim 9 wherein at least one of said transistors comprises a field effect transistor.

14. A push-pull amplifier comprising:

a first amplifier arrangement comprising:

first, second and third terminals for connection to a load, a first supply voltage and a second supply voltage, respectively, where the second supply voltage is higher than the first supply voltage, first and second transistors connected in series between the first and third terminals, a first semiconductor junction coupled between the second terminal and a first junction point between the first and second transistors, a third transistor connected as an emitter-follower having a base for receiving an input signal and an emitter coupled to a control electrode of the first transistor, said third transistor being of a conductivity type opposite to that of the first transistor, a first current source coupling the emitter of the third transistor to the third terminal, a first current path coupled between the third terminal and an electrode of the third transistor at which an input signal is present, said first current path comprising a series arrangement of a second current source, the emitter-collector path of a fourth transistor of the same conductivity type as the third transistor, and a second semiconductor junction, means coupling a control electrode of the second transistor to a second junction point between the second current source and the fourth transistor, a second current path coupled to the second terminal and comprising a series arrangement of third and fourth semiconductor junctions and a third current source, a fifth semiconductor junction coupling the fourth transistor to the third current source, means connecting a control electrode of the fourth transistor to a third junction point between the third and fourth semiconductor junctions, and a second amplifier arrangement complementary to said first amplifier arrangement and comprising:

fourth and fifth terminals for connection to third and fourth supply voltages, respectively, of opposite polarity to said first and second supply voltages, respectively, and with the fourth supply voltage being higher than the third supply voltage, fifth and sixth transistors complementary to the first and second transistors and serially connected between the fifth and first terminals, a sixth semiconductor junction coupled between the fourth terminal and a fourth junction point between the fifth and sixth transistors, a seventh transistor connected as an emitter-follower having a base for receiving the input signal ad an emitter coupled to a control electrode of the fifth transistor, said seventh transistor being of a conductivity type opposite to that of the fifth transistor, a fourth current source coupling the emitter of the seventh transistor to the fifth terminal, a third current path coupled between the fifth terminal and an electrode of the seventh transistor at which the input signal is present, said third current path comprising a series arrangement of a fifth current source, the emitter-collector path of an eighth transistor of the same conductivity type as the seventh transistor, and a seventh semiconductor junction, means coupling a control electrode of the sixth transistor to a fifth junction point between the fifth current source and the eighth transistor, a fourth current path coupled to the fourth terminal and comprising a series arrangement of eighth and ninth semiconductor junctions and the third current source, a tenth semiconductor junction coupling the eighth transistor to the third current source, and means connecting a control electrode of the eighth transistor to a sixth junction point between the eighth and ninth semiconductor junction.

15. A push-pull amplifier as claimed in claim 14 wherein collector electrodes of complementary third had seventh transistors of the first and second amplifiers arrangements are coupled to said first terminal.

* * * * *